United States Patent [19]
Schett et al.

[11] Patent Number: 5,302,899
[45] Date of Patent: Apr. 12, 1994

[54] METHOD AND DEVICE FOR COMPENSATING OF FIELD DISTURBANCES IN MAGNETIC FIELDS

[75] Inventors: Oskar Schett, Uster; Arthur Schwilch, Schwerzenbach, both of Switzerland

[73] Assignee: Spectrospin AG, Switzerland

[21] Appl. No.: 910,661

[22] Filed: Jul. 7, 1992

[30] Foreign Application Priority Data

Jul. 11, 1991 [EP] European Pat. Off. ........ 91111546.7

[51] Int. Cl.$^5$ .............................................. G01V 3/00
[52] U.S. Cl. ...................................... 324/318; 324/322; 324/317
[58] Field of Search .............. 324/300, 322, 307, 309; 335/282

[56] References Cited

U.S. PATENT DOCUMENTS 5,218,299  6/1993  Dunkel ................ 324/307

FOREIGN PATENT DOCUMENTS 466611   1/1969  Switzerland .
2019006 10/1979  United Kingdom .

OTHER PUBLICATIONS

Journal of Physics E. Scientific Instruments, vol. 2, No. 10, Oct. 1, 1969, Ishing, Bristol, GB.
M. Birkle et al.: "Modulation effects and their application in high resolution nuclear spectrometers".
Review of Scientific Instruments, vol. 46, No. 5, May 1, 1975, New York US.
B. W. Bangerter: "Field/frequency lock monitor for signal averaging with high resolution NMR spectrometers".
Journal of Physics E. Scientific Instruments, vol. 9, No. 4, Apr. 1, 1976, Ishing, Bristol GB.
J. K. Hulbert: "A field tracking digital NMR magnetometer for in situ use with superconducting solenoids".

Primary Examiner—Michael J. Tokar
Assistant Examiner—Raymond Y. Mah
Attorney, Agent, or Firm—Walter A. Hackler

[57] ABSTRACT

In a method for compensation of time variant field disturbances in magnetic fields of electromagnets with high field-homogeneity, in particular in sample volumes of superconducting electromagnets for measurements of magnetic resonance, the dispersion signal $u_x$ of the nuclear signal of a reference substance is acquired and taken into consideration for compensation by generation of a current dependent on the dispersion signal in a field correction coil of the electromagnet. The method is characterized in that the absorption signal $u_y$ of the reference substance is additionally acquired and that the compensation is carried out in dependence on the quantity $u_x/u_y$ and/or $(1/u_y)(du_x/dt)$. These are substantially independent of many influencing quantities.

18 Claims, 5 Drawing Sheets

METHOD AND DEVICE FOR COMPENSATING OF FIELD DISTURBANCES IN MAGNETIC FIELDS

BACKGROUND OF THE INVENTION

The present invention relates to a method for compensation of time variant field disturbances in magnetic fields of electromagnets with high field homogeneity, in particular in sample volumes of supra-conducting electromagnets for measurements of magnetic resonance, in said method the dispersion signal $u_x$ of the nuclear signal of a reference substance is acquired and used for compensation by generation of a current dependent on the dispersion signal in a field correction coil of the electromagnet.

In the known NMR field stabilization the dispersion signal $u_x$ of the nuclear resonance signal is used. In case of a deviation of the nuclear resonance signal from the nominal frequency the dispersion signal indicates immediately by its sign in which direction the compensation is to take effect.

The absorption signal $u_y$ is not used for the NMR field stabilization, the so-called NMR lock, but only for indication of the locked regulating state for the homogenization of the magnetic field by so-called "shimming". The absorption signal is known to be phase-shifted by 90° compared to the dispersion signal.

One endeavors to carry out the NMR field stabilization as exactly as possible in order to maintain the magnetic field as exactly constant as possible. In doing so small disturbing amplitudes leading to a small frequency change of the reference substance, as well as relatively great external magnetic disturbance amplitudes are to be compensated. The invention provides a new method for the NMR field stabilization.

SUMMARY OF THE INVENTION

In a method for compensation of time variant field disturbances in magnetic fields of electromagnets with high field-homogeneity, in particular in sample volumes of superconducting electromagnets for measurements of magnetic resonance, the dispersion signal $u_x$ the nuclear signal of a reference substance is acquired and taken into consideration for compensation by generation of a current dependent on the dispersion signal in a field correction coil of the electromagnet. The method is characterized in that the absorption signal $u_y$ of the reference substance is additionally acquired and that the compensation is carried out in dependence on the quantity $u_x/u_y$ and/or $(1/u_y)(du_x/dt)$. These are substantially independent of many influencing quantities.

According to the present invention it is provided that additionally the absorption signal $u_y$ of the reference substance is acquired and that the compensation is carried out in dependence on a combination of the weights quantities $u_x/u_y$ and $(1/u_y)(du_x/dt)$. The advantage is that the mentioned quantities are considerably independent of numerous limiting quantities, as explained below so that an exact field compensation is facilitated. This is rendered possible by the fact that according to the present invention the dispersion signal is combined with the, absorption signal of the reference substance. This weighting suitably chosen may result in that individually only a single one of the mentioned quantities is used for the compensation.

An embodiment of the invention provides that the compensation is carried out in dependence on the quantity $1/T_2 \cdot u_x/u_y$, $T_2$ being the spin-spin relaxation time of the reference substance. The advantage is that in case of small disturbance frequencies this quantity and in case of known $T_2$ the disturbance amplitude (according to a deviation of the frequency of the nuclear signal of the reference substance due to the disturbance) can directly be determined, see equation 1.38. This quantity is above all suitable for regulating field disturbances in the normal operating state with small disturbance amplitudes, because this quantity contains relatively few noise components and thus allows an exact fine regulation. For additional suppression of potentially existing noise components it may be useful to low pass filter the quantity $u_y$, which remains practically constant.

An embodiment of the present invention provides that the compensation is carried out in dependence on the quantity $1/T_2 \cdot u_x/u_y + 1/u_y \cdot du_x/dt$. The advantage is that this equation is exactly valid and is not bound by any conditions. This quantity allows a rough regulation in the case of large disturbance amplitudes with good dynamic properties. This quantity is not to be used by all means for a precision regulation, because this quantity has noise components which however are less relevant in a rough regulation. In contrast thereto with this rough regulation it is especially advantageous that the large disturbance amplitudes can be calculated and immediately compensated. The use of this quantity for compensation improves the retention and pull-in range of the regulation and thus avoids in many cases a departure from the pull-in range of the regulation.

In an embodiment of the invention the mentioned quantities and preferably also the control signals derived from these are determined by digital calculation. An advantage is then that adaptations can be effected by simple program changes. However, it is expressly pointed out that according to the present invention the regulation can also be carried out by using conventional electronic circuits.

A device in accordance with the present invention for carrying out the method according to the present invention has a phase-sensitive rectifier for obtaining the dispersion signal $u_x$ and the absorption signal $u_y$ of a nuclear signal and has a device for generating a quantity which is dependent on $u_x/u_y$, $(1/u_y)(du_x/dt)$ or on a combination thereof. This device and its embodiments have the above mentioned advantages.

An embodiment of the present invention provides that at least one measuring transducer is follow by a regulator, the input signal of the concerned regulator which is modified according to the control properties appearing at the output of said regulator. Thus the signal supplied by a measuring transducer can be modified.

An embodiment of the invention provides that there is a switching device for selecting the one quantity or the other quantity or a combination of the quantities; thus the desired signal can be selected.

An embodiment of the invention provides that there is a control device which controls the regulators and/or the switching device in dependence on the dispersion signal $u_x$ and the absorption signal $u_y$; thus, taking into consideration the dispersion signal and the absorption signal, the output signal of the one or the other measuring transducer can simply be affected and/or a combination of the two output signals can be used for compensation of the field change.

An embodiment of the invention provides a digital computer which determines the mentioned quantities.

An embodiment of the invention provides a field sensor arranged outside the electromagnet in order to compensate fast field variations of external disturbance sources.

BRIEF DESCRIPTION OF THE DRAWINGS

Further features and advantages result from the description of one embodiment of the invention by means of the drawing which shows details relevant for the invention and from the claims. The single features can be realized individually or in arbitrary combination thereof in an embodiment of the invention.

DETAILED DESCRIPTION OF THE PREFERRED EMBODIMENT

Figure 1:
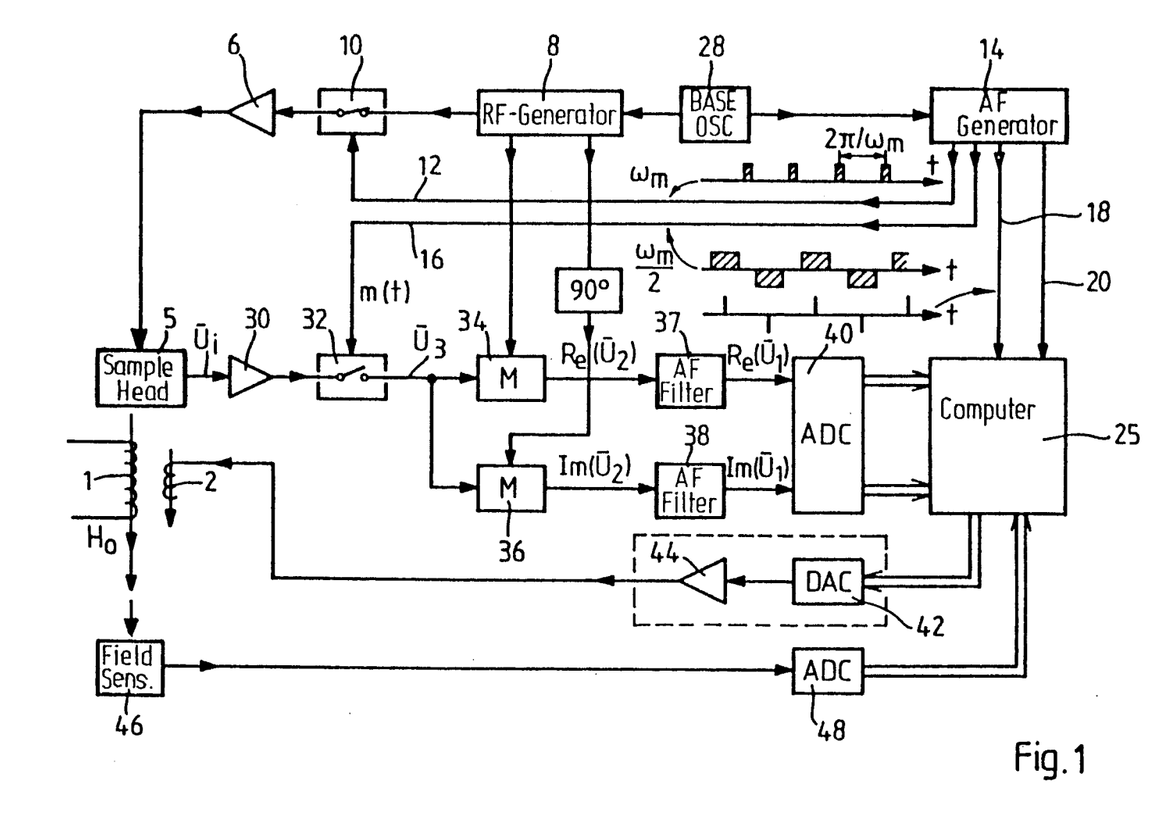
FIG. 1 shows the over-all scheme of a stabilization device.

FIG. 1 shows the parts of a NMR spectrometer necessary for understanding the invention and a stabilization device according to the invention. The NMR spectrometer has a field coil 1 which may be a superconducting coil and serves for generation of the field $H_0$ which is to have a very large field homogeneity, preferably an inhomogeneity of less than $10^{-5}$. A non-superconducting field correction coil 2 is provided coaxially to the field coil 1 in FIG. 1 for reasons of clarity, said field correction coil 2 is supplied with currents for compensation of time changes of the magnetic field $H_0$. The magnetic field generated by the field correction coil 2 is termed $\Delta H_{reg}$. A sample head 5 is provided which is, as usual, supplied with RF pulses for excitation of the nuclear magnetic resonance within a sample and which receives the nuclear spin signals. A RF transmitter 6 serves for supplying the sample head 5, the input of said RF transmitter 6 is connected with a RF generator 8, the generation of RF pulses being symbolized by a switch 10 inserted between the elements 6 and 8. The switch 10 is supplied via a control line 12 with switching pulses generated by an AF generator 14. In the shown example the switching pulses are square-wave pulses with the same polarity and the recurrence frequency (angular frequency) $\omega_m$.

On a control line 16 the AF generator 14 generates a further control signal of square-shaped pulses with alternating polarity and the pulse recurrence frequency $\omega_m/2$. Moreover, on a control line 18 the AF generator supplies a reference signal which has also the frequency $\omega_m/2$ and a timing signal on a timing circuit 20. The two last-mentioned signals are fed to a operating computer 25. The RF generator 8 and the AF generator 14 are controlled by a base oscillator 28.

The output signal of the sample head 5, the nuclear spin signal $\bar{U}_i$ is fed to two mixers 34 and 36 via an amplifier 30 and a controlled switch 32, the control input of which is connected with the control line 16. The switch 32 causes an alternating polarity reversal corresponding to the fed control signal (function m(t)).

The RF generator supplies the mixers with the same radio-frequency yet phase-shifted by 90°, in the example the output signal of the two mixers being in the AF range. Instead the transferring into the AF range could also be effected by one or several intermediate frequency stages. The output signals of the two mixers 34 and 36 are termed Re ($\bar{U}_2$) and Im ($\bar{U}_2$), i.e. as real component and imaginary component of $\bar{U}_2$. These signals are fed to inputs of an analog to digital converter 40 via an AF filter 37 and 38, respectively. Outputs of this converter are connected with inputs of the computer 5. Output signals of the computer 25 are fed to a digital to analog converter 42 the analog output signal of which is fed to the field correction coil 2 via an amplifier 44. The digital to analog converter 42 and the amplifier 44 form a controllable source of current.

Fast field changes caused by external disturbances (e.g. strong current variations in the power cable of a neighboring electric street car) are detected by a field sensor 46 and fed to the computer 25 via an analog to digital converter 48 which generates the corresponding correction signals and feeds them to the digital to analog converter 42. A compensator 80 shown in FIG. 2 effects a frequency-dependent compensation of these disturbances.

Figure 2:
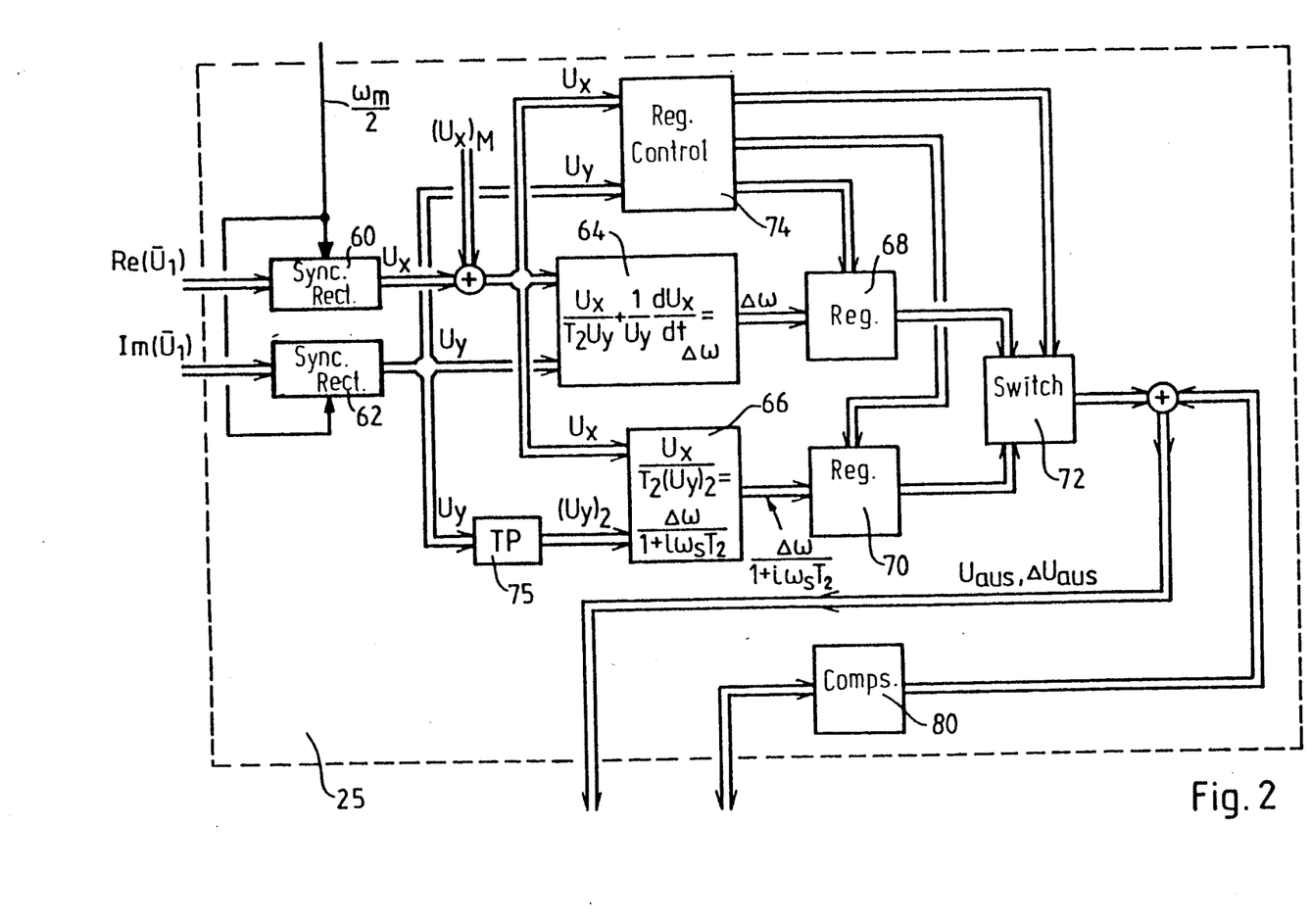
FIG. 2 shows a functional scheme of the computer of FIG. 1.

In the computer 25 the output signals of the AF filters 37 and 38 present in digital form are subjected to a synchronous rectification by using the reference signal supplied on the signal line 18 (the pulse form of said reference signal is shown in FIG. 1), which is indicated by function blocks 60 and 62. The rectified signals $u_x$ and $u_y$ are each transformed by a first measuring transformation 64 and a second measuring transformation 66 symbolized by a corresponding measuring transducer #1 and measuring transducer #2 according to formulas registered there. In doing so the signal uI is fed to the measuring transformation 66 via a low-pass the output signal of which is termed $(u_y)_2$. Via regulators 68 and 70 which are also realized only by calculating means the output signals of the measuring transducers are fed to a controlled switch 72 which selects the output signal of the regulator 68, of the regulator 70 or a combination of the two output signals and feeds the selected signal to the digital to analog converter 42.

The function blocks shown in FIG. 2 are for a better functional understanding and are realized only by calculating means. The two nuclear spin signals $u_x$ and $u_y$ being in quadrature to one another are treated in two parallel running calculating chains consisting of a measuring transducer and a regulator are and connected through in the switch either individually or first added with suitable weighting and then connected through.

A regulator control 74 is provided which, taking into consideration the signals $u_x$ and $u_y$ and on the basis of a stored table generates regulating parameters for the two regulators 68 and 70 and switching commands for the switch 72.

The signals and voltage values shown in FIGS. 1 and 2 refer to the terms and calculations following below.

Figure 3:
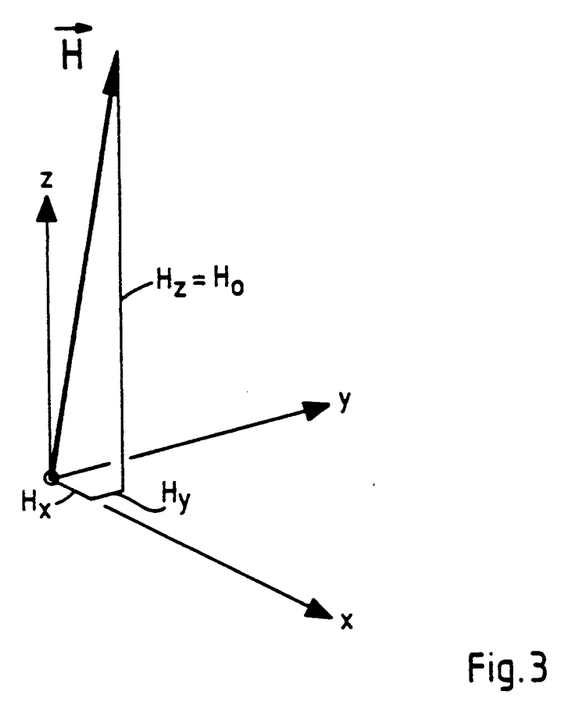
FIG. 3 shows the field vector $\bar{H}$ in the Cartesian coordinate system.
Figure 4:
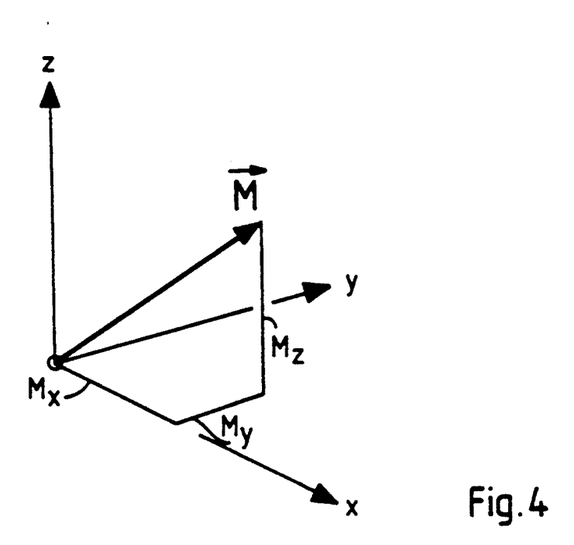
FIG. 4 shows the magnet vector $\bar{M}$ in the Cartesian coordinate system.
Figure 5:
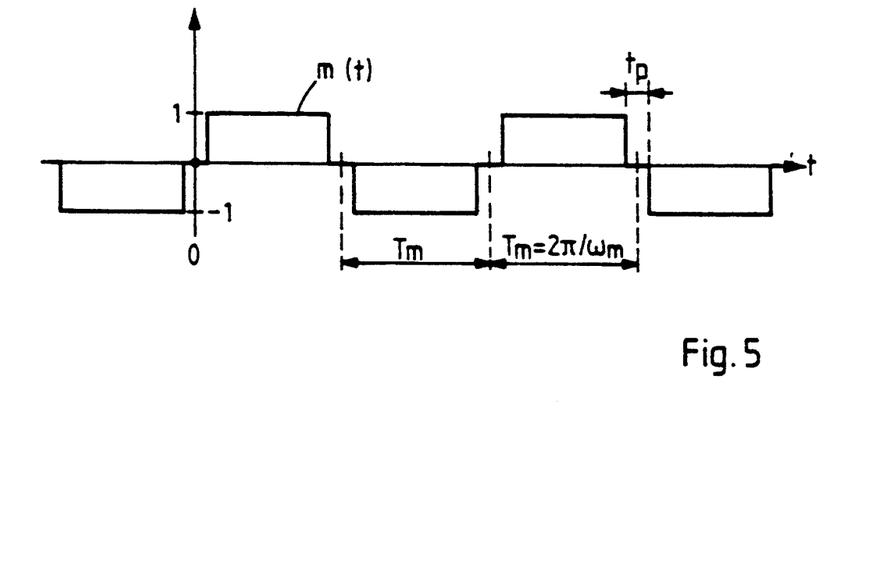
FIG. 5 shows the time function of a switching function.
Figure 6:
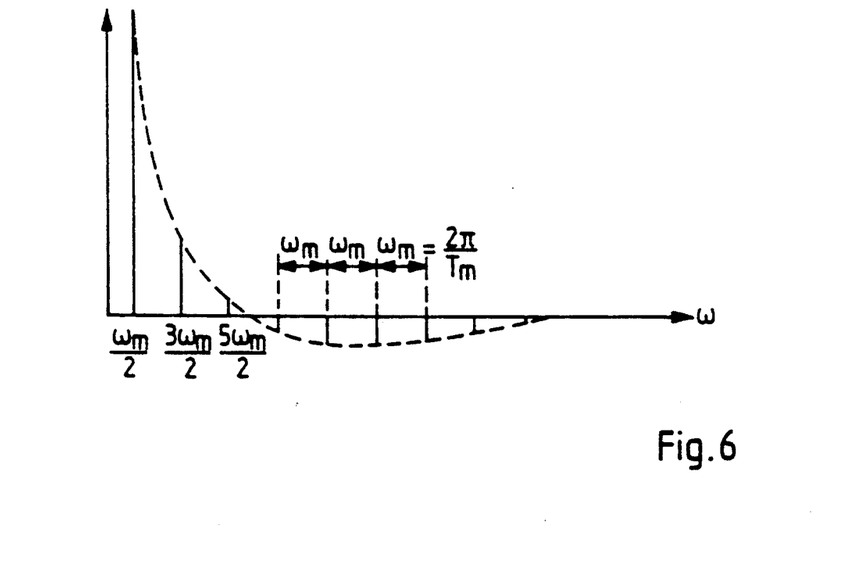
FIG. 6 shows the frequency spectrum of the same switching function as in FIG. 5.

The vectors shown in FIGS. 3 and 4 as well as the switching function m(t) shown in FIGS. 5 and 6 are known and used in the following discussion.

A NMR field stabilizator uses the nuclear resonance signal in order to derive a field proportional measuring quantity by which a regulation of the $H_0$ field strength to a constant value can be achieved.

Below, the nuclear resonance signal is derived mathematically. Starting from the Bloch equations, which characterize the nuclear spin system, the signal induced in the receiving coil is calculated, the modulation of this signal by switching on and off of the receiver is considered; a guadrature detection with following synchronous rectification is included and finally the output signals $u_x$ and $u_y$ of the two quadrature channels are determined.

In order to carry out the suggested method in an elegant and easily modifiable fashion, a great part of the function units were realized mathematically. Thus one obtains a maximum of flexibility, because the relevant parameters and operations are realized by software and can be easily changed.

If one starts from a given field disturbance $\gamma \Delta H_0 \cos \omega_s t = \Delta \omega \cos \omega_s t$ with sufficiently small disturbance amplitude $\Delta \omega$ (i.e. $(\Delta \omega)^2 T_2^2 << 1$) and the disturbance frequency $\omega_s$ and calculates the influence of this disturbance on the nuclear spin signals $u_x$ and $u_y$, this leads to the equations (1.32) and (1.33). This reveals that this field disturbance does not affect $u_y$ and becomes apparent only in $u_x$. $u_x$ is again written in equations (1.36) and this as pointer in the complex plane. The expression in parenthesis shows exactly the transfer function of a low-pass and characterizes the inertia of the nuclear spin system which hardly reacts to very fast field variations.

(1.36) also shows that $u_x$ depends on very many parameters such as receiving amplification $k_{tot}$, transmitter amplitude $H_1$, saturation parameter $\gamma^2 H_1^2 T_1 T_2$, etc. Whereas, if one devides $\overline{U}_x$ by $u_y$, then all these parameters fall out and the very simple equation (1.37) results.

This division step can already be considered as an adaptive step which evaluates the effects of different varying parameters and compensates them in this case.

Another important relation is the equation (1.39). It supplies directly the exact value of the disturbance amplitude also with large values of $\Delta \omega$. But for doing so it needs apart from the value $u_x(T_2 u_y)$, which is already known from (1.38), also the differential quotient $du_x/dt$. However, this differentiation also has a disadvantage, because the frequency spectrum of the noise signal is increased proportional to the frequency and thus the calculation of $\Delta \omega$ becomes inaccurate.

For small disturbance amplitudes $\Delta \omega$, $u_y$ may be assumed to be constant and then the equation (1.39) is a linear differential equation which could also be realized by filtering. The amplitude characteristic of this filter would run flattly up to the frequency $\omega = 1/T_2$ and from thereon increasing with 20 decibels/decade. The complex transfer function $\overline{E}$ of this filter would be given by $$E = 1 + i\omega_s T_2$$

and it becomes apparent that this filter would exactly compensate the low-pass character of $u_x$ (see equation 1.37) and result in a value exactly proportional to $\Delta \omega$.

However, the equation (1.39) is capable of more than the above filter, because it determines the value $\Delta \omega$ correctly even under the influence of large disturbance amplitudes when $u_y$ cannot be assumed to be constant. It has to be observed that as soon as $u_y$ is not constant any more this equation represents a non-linear differential equation and thus also expresses the known non-linear character of the nuclear spin system.

In view of the fact that the first measuring transducer 64 yields a quantity $\Delta \omega$ independent of the disturbance frequency $\omega_s$, i.e. has a flat amplitude characteristic, it is sufficient to design the first regulator 68 as an amplifier with low-pass character for fulfilling the stability criterion in the simplest embodiment. The second measuring transducer 66 already supplies a signal with low-pass character so that in the simplest embodiment the second regulator 70 can be designed as an amplifier with flat amplitude characteristic.

In both cases one obtains improved properties if in both regulators one additionally uses integrating or even better double-integrating elements which are allowed to exert their integrating properties only in the lower frequency range of the regulating band width due to reasons of regulatory stability.

The first channel with the first measuring transducer 64 and the first regulator 68 has excellent dynamic properties and is above all suitable as rough regulation with large disturbance amplitudes $\Delta \omega$, because then the disadvantage of greater noise in this channel is less relevant when compared to the advantage of an exact calculation of $\Delta \omega$. This first channel also improves the retention range and the pull-in range of the regulation and in many cases thus avoids that it falls out of the locked state.

The second channel with the second measuring transducer 66 and the second regulator 70 has a dynamic property limited by $T_2$ and is suitable for the normal operating state and with small amplitudes, because above all it has less noise and thus allows an exacter fine regulation. Because in this case $u_y$ remains practically constant with small disturbance amplitudes, this signal is first guided via a low-pass 75 before it is supplied to the second measuring transducer 66. Thus additionally existing noise components are filtered.

The regulator-control 74 calculates the optimum parameters for the regulators 68 and 70 out of the two nuclear spin signals $u_x$ and $u_y$ and with which weighting the two methods of the measuring transformation are inserted into the regulation loop. In the normal operating state and if only small disturbance amplitudes exist, it will prefer the second channel and switch off the first channel. As soon as large disturbances occur this can be determined especially on the basis of the signal $u_x$ and the regulator-control co-switches the first channel or switches totally to the first channel and this so long as the disturbance has disappeared again. Afterwards it is again switched to the second channel. If greater disturbances are always present, then the two channels are activated and the weighting distribution between these two channels is chosen in such a way that an optimum compromise is achieved between disturbance suppression and noise minimization. In view of the fact that all these steps are carried out mathematically it is very simple to use other weighting methods as well. In particular due to changes of the regulation parameters the frequency characteristics of the two regulators can also be changed and optimimized dependent on the size of the disturbance amplitude.

The relaxation time $T_2$ which is needed for the calculation in the two measuring transducers 64 and 66 can be entered as an estimated value to a first approximation. However, in order to better optimize the regulation $T_2$ has to be know exactly. This can be achieved by a special measuring step because by addition of a signal $(u_x)_M$ at a suitable place of the regulation loop a dispersion signal $u_x$ which can be determined in advance is generated. A suitable place for this addition is the output of the synchronous rectifier 60 in the x-channel (see FIG. 2). The field stabilizer reacts to this measure by generating a field change via the second regulator 70, the current source 42, 44 and the field correction coil 2, said field change leads to a dispersion signal $u_x$ with which the field stabilizer tries to compensate the supplied signal $(u_x)_M$. The greater the amplification of the second regulator 70 and the current source is, the exacter it will achieve this. Thus with sufficiently great amplification and after achievement of the stationary state $$u_x = -(u_x)_M$$

is valid. Moreover, in the stationary state $\omega_s = 0$ and $u_y = (u_y)_2$ is valid and equation (1.38) reduces to $$\Delta\omega = \frac{1}{T_2} \frac{u_x}{(u_y)_2} = \frac{1}{T_2} \frac{-(u_x)_M}{(u_y)_2}$$

$$T_2 = \frac{-(u_x)_M}{\Delta\omega (u_y)_2}$$

In the right part of this equation everything is known except the frequency change $\Delta\omega = \gamma\Delta H_0$ which can yet be determined via the field change $\Delta H_0$ generated in the field correction coil 2. $\Delta H_0$ is generated by a signal change $\Delta u_{aus}$ which can be measured at the output of the computer 25 (see FIG. 2) and because the relation $\Delta H_0/\Delta u_{aus} = g_0$ is known one obtains for $\Delta\omega$:

$$\Delta H_0 = g_0 \Delta u_{aus}$$

$$\Delta\omega = \gamma\Delta H_0 = \gamma g_0 \Delta u_{aus}$$

Inserted in the equation for $T_2$:

$$T_2 = \frac{-(u_x)_M}{\gamma g_0 \Delta u_{aus} (u_y)_2}$$

It has to be observed that with this measuring the compensator 80 (see FIG. 2) which will be described later on has to be switched off. Moreover, it has to be observed that the measuring of $T_2$, described above, is effected in the switched-on operating state of the field stabilizator, i.e with locked regulation loop.

Figure 7:
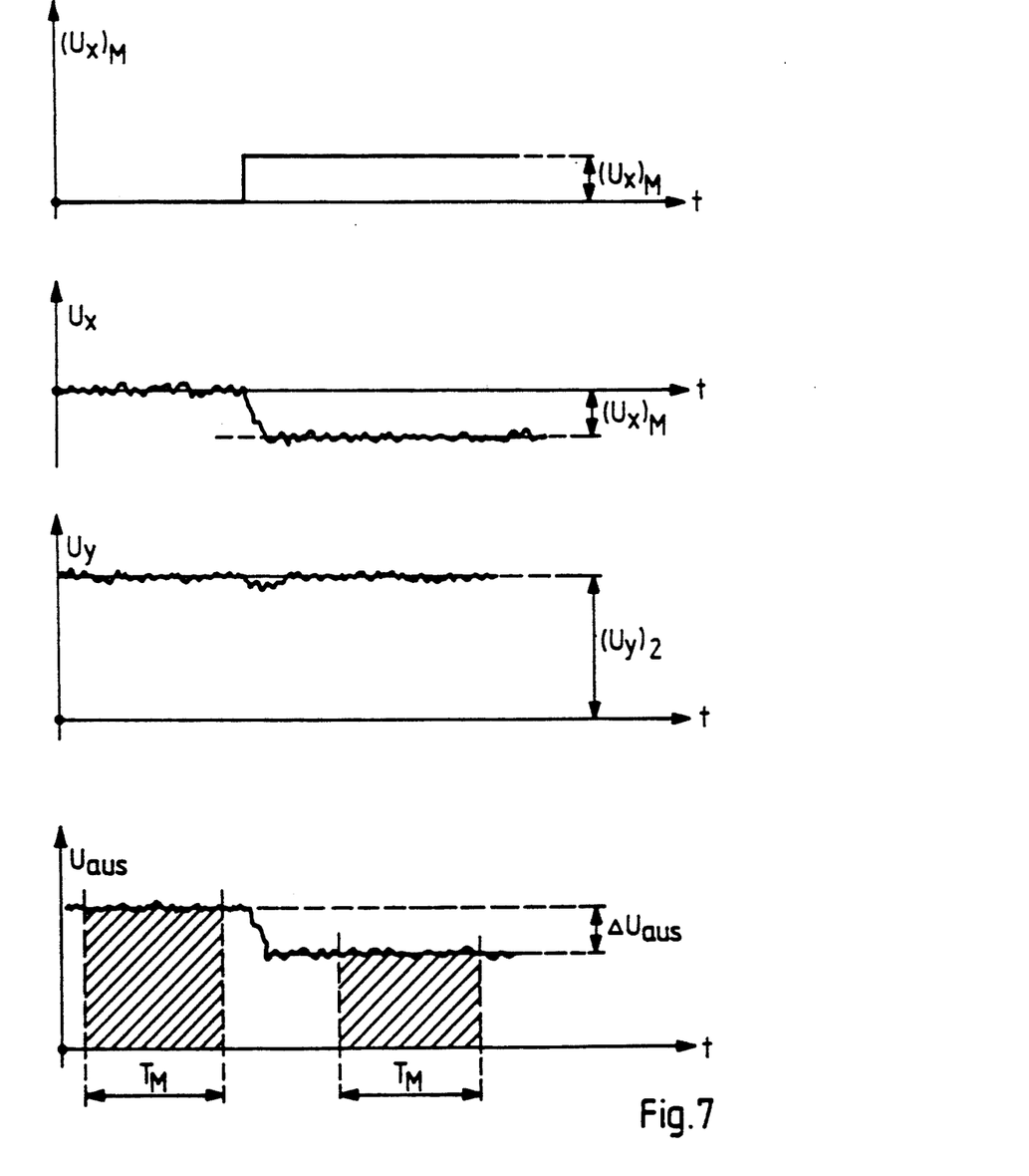
FIG. 7 shows measuring quantities for determining $T_2$.

For better understanding the signals $(u_x)_M$, $u_x$, $u_y$ and $u_{aus}$ are shown in FIG. 7. The signal $\Delta u_{aus}$ is determined by subtraction of two signal levels which have to be averaged each over a sufficiently long measuring time $T_M$ in order to reduce the influence of field disturbances and noise.

Fast field disturbances of external disturbance sources cannot be satisfactorily suppressed by the regulation loop described. The first channel with its high dynamic would principally already be suitable to regulate such disturbances, but the additional noise in this channel forces a limitation in the dynamic range. For this reason another sensor, the field sensor 46, was inserted which can detect field disturbances outside the whole magnet system. There these field disturbances are much stronger than at the place of the NMR sample because they are not shielded or partly compensated by the conducting metal components of the cryostat and the superconducting coil and there these disturbances can be detected also with simpler and faster reacting measuring elements (such as e.g. Foerster probe and Hall probe). However, in doing so there is the disadvantage that the relation of field disturbance at the place of the sample to external field disturbance is frequency dependent (due to the frequency dependent penetration depth into metallic structures of the magnetic coil and/or a cryostat) and that, therefore, the externally detected signal has first to be subjected to a frequency characteristic correction (is effected in the compensator 80 of the FIG. 2), before it reaches the field correction coil in order to perform there the desired compensation of the fast field disturbances. With this compensation method it is a problem to find the right frequency characteristic correction, which yet can be determined by measuring and by falling back to mathematical methods for data processing. In view of the fact that the disturbance fields detected by the field sensor 46 can be regarded as homogeneous and mostly only the part of the disturbance fields which extends in direction of the $H_0$ field has to be taken into consideration one single field sensor is sufficient in most cases.

Now on the basis of the Bloch equations for the detected NMR signal are derived which have partly been cited above.

The nuclear spin system is characterized by its magnetization vector $\overline{M}$ which in turn is assumed to be influenced by a field vector $\overline{H}$. $\overline{H}$ and $\overline{M}$ are to be defined by Cartesian coordinates (see FIGS. 3 and 4).

The Bloch equations which define the moving state of $\overline{M}$ are (see "Handbook of Physics", S. Fluegge, Volume XXXVIII/1, page 130, equations 2.6):

$$\frac{dM_x}{dt} + \frac{M_x}{T_2} = \gamma(M_y H_z - M_z H_y) \quad (1.1)$$

$$\frac{dM_y}{dt} + \frac{M_y}{T_2} = \gamma(M_z H_x - M_x H_z) \quad (1.2)$$

$$\frac{dM_z}{dt} + \frac{M_z - M_0}{T_1} = \gamma(M_x H_y - M_y H_x) \quad (1.3)$$

Now if we newly define the xy plane as complex plane and term x as the real and y as the imaginary axis, then we have:

$$\overline{F} = H_x + iH_y \quad (1.4)$$

$$\overline{G} = M_x + iM_y \quad (1.5)$$

If one multiplies equation (1.2) with i and adds it to (1.1) and if one additionally inserts the two equations (1.4) and (1.5) then the three Bloch's equations can be reduced to two equations:

$$\frac{d\overline{G}}{dt} + \left(\frac{1}{T_2} + i\gamma H_z\right)\overline{G} = i\gamma M_z \overline{F} \quad (1.6)$$

$$\frac{dM_z}{dt} + \frac{M_z - M_0}{T_1} = -\gamma \, Im\,(\overline{GF^*}) \quad (1.7)$$

$\overline{G}$ and $M_z$ are the unknown quantities. "Im $(\overline{GF^*})$" is the imaginary component of the product $\overline{G}$ times complex conjugate of $\overline{F}$.

Now the field vector $\overline{H}$ more exactly defined, step by step. In the first step one defines only a constant z-component $H_0$ and assume the x- and y-components to be zero. This corresponds to the state of the free precession of the nuclear spins:

$$\left. \begin{array}{l} H_x = 0 \\ H_y = 0 \end{array} \right\} \text{which means } \overline{F} = 0$$

-continued
$H_z = H_0 = \omega_0/\gamma$ (= static polarization field)

Inserted into equation (1.6):

$$\frac{d\overline{G}}{dt} + \left(\frac{1}{T_2} + i\omega_0\right)\overline{G} = 0$$

Solution of the differential equation:

$$\overline{G} = Ae^{-\frac{t}{T_2}}e^{-i\omega_0 t} \quad (1.8)$$

The magnetization component $\overline{G}$ in the xy-plane decays at a time constant $T_1$, and which is important for further reflections, it rotates clock-wise with the angular frequency $\omega_0 = \gamma H_0$.

In the second step we insert additionally to the z-component $H_Z = H_0 = \omega_0/\gamma$ a rotary field $\overline{F}$ i the xy-plane which is to serve for excitation of the nuclear spin system and therefore to rotate in the same orientation as the freely precessing spins, i.e. also clock-wise, but at an angular frequency $\omega$ which is to be slightly different from $\omega_0$:

$$\overline{F} = H_1 e^{-i\omega t} \quad (1.9)$$

Inserted in (1.6) and (1.7) and with $H_Z = \omega_0/\gamma$:

$$\frac{d\overline{G}}{dt} + \left(\frac{1}{T_2} + i\omega_0\right)\overline{G} = iM_z\gamma H_1 e^{-i\omega t} \quad (1.10)$$

$$\frac{dM_z}{dt} + \frac{M_z - M_0}{T_1} = -\gamma H_1 \, Im\, (\overline{G}e^{i\omega t}) \quad (1.11)$$

The solution for $\overline{G}$ from the two above differential equations can principally be shown by an amplitude change $a(t)$ and phase change $\phi(t)$ in time:

$$\overline{G} = a(t)e^{-i(\omega t + \phi(t))} = M_x + iM_y \quad (1.12)$$

The receiver coil of the NMR spectrometer is to be orientated in y-direction and thus only the component $M_y$ is relevant for the nuclear resonance signal $u_i$ induced in the receiver coil:

$$u_i = -k_1 \frac{dM_y}{dt}$$

$$M_y = -a(t)\sin(\omega t + \phi(t))$$

$$u_i = k_1\left(a(t)\left(\omega + \frac{d\phi(t)}{dt}\right)\cos(\omega t + \phi(t)) + \frac{da(t)}{dt}\sin(\omega t + \phi(t))\right)$$

$$u_i = k_1\omega\left(a(t)\left(\cos(\omega t + \phi(t)) + \frac{d\phi(t)}{\omega dt}\cos(\omega t + \phi(t))\right) + \frac{da(t)}{a(t)\omega dt}\sin(\omega t + \phi(t))\right)$$

In view of the fact that in the NMR spectroscopy usually the two conditions $$\omega >> \frac{d\phi(t)}{dt}, \omega >> \frac{da(t)}{a(t)dt}$$

are fulfilled, only the first term of a sum in the equation for $u_i$ is relevant:

$$u_i = k_1\omega a(t)\cos(\omega t + \phi(t))$$

In order to keep the complex writing one defines a complex NMR signal $\overline{U}_i$ and in doing so only considers the real component:

$$\overline{U}_i = k_1\omega a(t)e^{-i(\omega t + \phi(t))} \quad (1.13)$$

Owing to the on- and off-switching of the receiver with alternating polarity (as per se known from DE-C2-22 37 891) $\overline{U}_i$ is multiplied with a periodic switching function $m(t)$ (see FIGS. 5 and 6). Thus $\overline{U}_3$ is generated:

$$\overline{U}_3 = m(t)\overline{U}_i = k_1\omega m(t)\, a(t)e^{-i(\omega t + \phi(t))} \quad (1.14)$$

In the receiver the signal $\overline{U}_3$ is mixed down twice to the AF range in a quadrature mixing step and this with the aid of two local oscillators with the same frequency m as the signal $\overline{U}_3$, however with phases which are phase-shifted by 90° to one another. These two mixing steps can mathematically be replaced by a multiplication of $\overline{U}_3$ with two pointers (a pointer is a rotating vector in the complex plane) $g_2 \cdot e^{i\omega t}$ and $-ig_2 e^{i\omega t}$ which are phase-shifted by 90° to one another and rotate in opposite direction to signal $\overline{U}_3$. The first mixture yields $\overline{U}_{x2}$:

$$\overline{U}_{x2} = \overline{U}_3 g_2 e^{i\omega t} = k_1\omega g_2\, m(t)\, a(t)e^{-i\phi(t)}$$

The second mixture yields:

$$\overline{U}_{y2} = \overline{U}_3(-ig_2 e^{i\omega t}) = -ik_1\omega g_2 m(t)a(t)e^{-i\phi(t)} = -i\overline{U}_{x2}$$

The actual quadrature signals are according to definition given by the real components of the complex signals $\overline{U}_{x2}$ and $\overline{U}_{y2}$:

$$u_{x2} = Re(\overline{U}_{x2})$$

$$u_{y2} = Re(\overline{U}_{y2}) = Re(-i\overline{U}_{x2}) = Im(\overline{U}_{x2})$$

Thus it is sufficient only to consider the complex signal $\overline{U}_{x2}$ and in doing so to observe that the signals $u_{x2}$ and $u_{y2}$ in the two quadrature channels are given by the real and imaginary component of $\overline{U}_{x2}$, respectively. In lieu of $\overline{U}_{x2}$ the simpler term $\overline{U}_2$ is to be used:

$$\overline{U}_2 = \overline{U}_{x2} = k_1\omega g_2\, m(t)\, a(t)e^{-i\phi(t)}$$

and in view of the fact that from equation (1.12) the relation $$a(t)e^{-i\phi(t)} = \overline{G}e^{i\omega t}$$

can be derived, one obtains for $\overline{U}_2$:

$$\overline{U}_2 = k_1\omega g_2 m(t)\overline{G}e^{i\omega t} \quad (1.15)$$

The switching function $m(t)$ is shown in FIGS. 5 and 6 and also indicated in FIG. 1 and comprises single frequency components at separations of $\omega_m$, wherein the first component is at $\omega_m/2$.

Via the selective AF filters 37, 38 (see FIG. 1) only the first component $m_1 \sin(\omega_m t/2)$ is transferred. Therefore m(t) can be replaced by the above function and one obtains for the signal at the output of the AF filter 37, 38:

$$\overline{u}_1 = k_1 \omega \, g_2 \, m_1 \sin\left(\frac{\omega_z t}{2}\right) \overline{G} e^{i\omega t} \quad (1.16)$$

In the following synchronous rectifier 60, 62 the negative half-wave of $\sin(\omega_m t/2)$ is switched into the positive range and thereof the direct current component g1 is determined. Therefore, $\sin(\omega_m t/2)$ can by replaced by g1 and one obtains for the signal at the ouput of the synchronous rectifier 60, 62:

$$\overline{U} = k_1 \omega g_2 m_1 g_3 \overline{G} e^{i\omega t}$$

or $$\overline{U} = k_{tot} \overline{G} e^{i\omega t} = u_x + i u_y \quad (1.17)$$

wherein $k_{tot} = k_1 \omega g_2 m_1 g_3$ $u_x$ and $u_y$ are the signals in the two quadrature channels.

Equation (1.17) solved for $\overline{G}$ yields $$\overline{G} = \frac{\overline{U}}{k_{tot}} e^{-i\omega t}$$

and inserted in (1.19) and (1.11) this leads to the desired differential equations for the detected NMR signal:

$$\frac{d\overline{U}}{dt} + \left(\frac{1}{T_2} + i(\omega_0 - \omega)\right)\overline{U} = i k_{tot} \gamma H_1 M_z \quad (1.18)$$

$$\frac{dM_z}{dt} + \frac{M_z - M_0}{T_1} = -\frac{\gamma H_1}{k_{tot}} Im(\overline{U}) = -\frac{\gamma H_1}{k_{tot}} u_y \quad (1.19)$$

By inserting $\overline{U} = u_x + i u_y$ in equations (1.18) one obtains from the two above diffential equations the following three differential equations:

$$\frac{du_x}{dt} + \frac{u_x}{T_2} - (\omega_0 - \omega) u_y = 0 \quad (1.20)$$

$$\frac{du_y}{dt} + \frac{u_y}{T_2} + (\omega_0 - \omega) u_x = k_{tot} \gamma H_1 M_z \quad (1.21)$$

$$\frac{dM_z}{dt} + \frac{M_z - M_0}{T_1} = -\frac{\gamma H_1}{k_{tot}} u_y \quad (1.22)$$

Examination of some special cases

Case 1

$\omega$ = constant
$\omega_0$ = constant

After the nuclear spin system has swung into this state, the stationary state is achieved and the time-dependent components $du_x/dt$, $du_y/dt$ and $dM_z/dt$ can be neglected, i.e. by zero. Thus is valid:

$$\frac{u_x}{T_2} - (\omega_0 - \omega) u_y = 0$$

$$\frac{u_y}{T_2} + (\omega_0 + \omega) u_x = k_{tot} \gamma H_1 M_z$$

$$\frac{M_z - M_0}{T_1} = -\frac{\gamma H_1}{k_{tot}} u_y$$

This is an equation system with three equations and three unknown quantities $u_x$, $u_y$ and $M_z$. The solution yields:

$$u_x = k_{tot} M_0 \gamma H_1 T_2 \frac{T_2(\omega_0 - \omega)}{1 + T_2^2(\omega_0 - \omega)^2 + \gamma^2 H_1^2 T_1 T_2} \quad (1.23)$$

$$u_y = k_{tot} M_0 \gamma H_1 T_2 \frac{1}{1 + T_2^2(\omega_0 - \omega)^2 + \gamma^2 H_1^2 T_1 T_2} \quad (1.24)$$

$$M_z = M_0 \frac{1 + T_2^2(\omega_0 - \omega)^2}{1 + T_2^2(\omega_0 - \omega)^2 + \gamma^2 H_1^2 T_1 T_2} \quad (1.25)$$

$u_x$ is the dispersion signal,
$u_y$ is the absorption signal.

Case 2

$$\omega_0 = \omega + \gamma \Delta H_0 \cos \omega_s t = \omega + \Delta\omega \cos \omega_s t$$

This case corresponds to the state when the NMR field stabilizer is locked and the Larmor frequency $\omega_0$ of the nuclear spins is regulated by change of the field strength $H_0$ to the value of the excitation frequency $\omega$, but wherein a periodic field change $\gamma \Delta H_0 \cos \omega_s t$ still exists with the disturbance frequency $\omega_s$. The nuclear resonance signals $u_x$ and $u_y$ under the influence of this periodic field change are searched for. It will show that a simple solution exists only in the case of small disturbance amplitudes $\Delta\omega$.

Initial solution:

$$(\omega_0 - \omega) = \Delta\omega \cos\omega_s t \text{ (given)} \quad (1.26)$$

$$u_x = A \cos\omega_s t + B \sin\omega_s t$$

$$u_y = k_{tot} M_0 \gamma H_1 T_2 \frac{1}{1 + \gamma^2 H_1^2 T_1 T_2} \quad (1.27)$$

$$M_z = \frac{M_0}{1 + \gamma^2 H_1^2 T_1 T_2} \quad (1.28)$$

The initial solutions for $u_y$ and $M_z$ are the values of the equations (1.24) or (1.25), if $(\omega_0 - \omega) = 0$ is inserted. The above initial solutions are valid for the swung-in state. Inserted in the differential equations (1.20), (1.21) and (1.22) this leads to the following three equations:

$$-A\omega_s \sin\omega_s t + B\omega_s \cos\omega_s t + (A/T_2)\cos\omega_s t +$$

$$(B/T_2)\sin\omega_s t - \Delta\omega \cos\omega_s t \frac{k_{tot} M_0 \gamma H_1 T_2}{1 + \gamma^2 H_1^2 T_1 T_2} = 0$$

$$\frac{k_{tot} M_0 \gamma H_1}{1 + \gamma^2 H_1^2 T_1 T_2} + \Delta\omega \cos\omega_s t \, (A \cos\omega_s t +$$

$$B \sin\omega_s t) = \frac{k_{tot} M_0 \gamma H_1}{1 + \gamma^2 H_1^2 T_1 T_2}$$

$$\frac{1}{T_2}\left(\frac{M_0}{1+\gamma^2H_1^2T_1T_2} - M_0\right) = \frac{-M_0\gamma^2H_1^2T_2}{1+\gamma^2H_1^2T_1T_2}$$

The third equation is exactly fulfilled. The second equation can also be fulfilled if the following condition is valid:

$$\Delta\omega\cos\omega_s t\,(A\cos\omega_s t + B\sin\omega_s t) << \frac{k_{tot}M_0\gamma H_1}{1+\gamma^2H_1^2T_1T_2} \quad (1.29)$$

As soon as A and B are calculated the above inequality has to be newly formulated and therefrom a usable condition has to be derived which defines the validity range of the used initial solutions.

From the first equation A and B is calculated:

$$-A\omega_s + (B/T_2) = 0$$

$$B\omega_s + A/T_2 - \Delta\omega\frac{k_{tot}M_0\gamma H_1 T_2}{1+\gamma^2H_1^2T_1T_2} = 0$$

$$A = \frac{k_{tot}M_0\gamma H_1 T_2}{1+\gamma^2H_1^2T_1T_2}\frac{\Delta\omega T_2}{1+\omega_s^2T_2^2} \quad (1.30)$$

$$B = \frac{k_{tot}M_0\gamma H_1 T_2}{1+\gamma^2H_1^2T_1T_2}\frac{\Delta\omega T_2\,\omega_s T_2}{1+\omega_s^2T_2^2} \quad (1.31)$$

Inserted in the condition (1.29):

$$(\Delta\omega T_2)^2 << \frac{1+\omega_s^2T_2^2}{\cos^2\omega_s t + \sin\omega_s t\cos\omega_s t\,\omega_s T_2}$$

$$(\Delta\omega T_2)^2 << \frac{1+\omega_s^2T_2^2}{\sqrt{1+\omega_s^2T_2^2}}$$

$$(\Delta\omega T_2)^2 << 1$$

(1.30) and (1.31) inserted in (1.26) yields the desired result:

$$u_x = \frac{k_{tot}M_0\gamma H_1 T_2}{1+\gamma^2H_1^2T_1T_2}\Delta\omega T_2\frac{\cos\omega_s t + \omega_s T_2\sin\omega_s t}{1+\omega_s^2T_2^2} \quad (1.32)$$

$$u_y = \frac{k_{tot}M_0\gamma H_1 T_2}{1+\gamma^2H_1^2T_1T_2} \quad (1.33)$$

$$M_z = \frac{M_0}{1+\gamma^2H_1^2T_1T_2} \quad (1.34)$$

wherein $(\Delta\omega T_2)^2 << 1 \quad (1.35)$ has to be valid.

It has to be observed that here a field change $\Delta\omega\cos\omega_s t$ affects only $u_x$ and that $u_y$ as well as $M_z$ remain unaffected.

$u_x$ can also be indicated as pointer in the complex plane by replacing $\cos\omega_s t + \omega_s T_2\sin\omega_s t$ by the pointer $1-i\omega_s T_2$:

$$\cos\omega_s t + \omega_s T_2\sin\omega_s T = Re((1-i\omega_s T_2)e^{i\omega_s t})$$

Thus one obtains the very simple term for $u_x$:

$$\overline{U}_x = \frac{k_{tot}M_0\gamma H_1 T_2}{1+\gamma^2H_1^2T_1T_2}\Delta\omega T_2\frac{1}{1+i\omega_s T_2} \quad (1.36)$$

wherein $(\Delta\omega T_2)^2 << 1$

It can be easily seen that the term in parentheses corresponds exactly to the transferring function of a low-pass with the limit frequency $1/T_2$ (expressed as angular frequency) and with $\omega_s$ as transfer frequency.

An interesting quantity is $$\frac{\overline{U}_x}{u_y} = \Delta\omega T_2\left(\frac{1}{1+i\omega_s T_2}\right) \quad (1.37)$$

wherein $(\Delta\omega T_2)^2 << 1$

This term is very useful, because it is independent of many paramters as receiving amplification $k_{tot}$, transmitter amplitude $H_1$ and saturation parameter $\gamma^2H_1^2T_1T_2$. For lower disturbance frequencies $\omega_s$ (i.e. $\omega_s^2T_2^2 << 1$) and with known $T_2$ the disturbance amplitude $\Delta\omega$ can be directly derived therefrom:

$$\Delta\omega = \frac{1}{T_2}\frac{u_x}{u_y} \quad (1.38)$$

wherein $(\Delta\omega T_2)^2 << 1$ and $(\omega_s T_2)^2 << 1$

A further interesting quantity can be directly derived from (1.20) if one inserts the term $\Delta\omega$ for $\omega_0 - \omega$:

$$\Delta\omega = \frac{1}{T_2}\frac{u_x}{u_y} + \frac{1}{u_y}\frac{du_x}{dt} \quad (1.39)$$

This equation is exactly valid and not bound to any conditions. In the first term of the sum, one recognizes the equation (1.38). The second term of the sum with the differential quotient $du_x/dt$ supplies the required quantity in order to guarantee the independence of the two conditions $(\Delta\omega T_2)^2 << 1$ and $(\omega_s T_2)^2 << 1$

What is claimed is:

1. Method for compensation of time varying field disturbances in magnetic fields of electromagnets with high field homogeneity using a field correction coil and an NMR RF transmitter and receiver said method comprising the steps of:

a) exciting a reference substance with the NMR transmitter;
   b) detecting an NMR signal with the NMR receiver;
   c) separating the NMR signal into a dispersion signal $u_x$ and an absorption signal $u_y$;
   d) converting the dispersion signal $u_x$ and absorption signal $u_y$ into a first weighted signal $u_x/u_y$ and a second weighted signal $(1/u_y)(du_x/dt)$;
   e) generating a current, dependent on the weighted signals, in the field correction coil for compensating a field disturbance; and
   f) repeating the steps a) through e) to compensate the time varying field disturbances.

2. Method according to claim 1, wherein the compensation is carried out in dependence on a quantity $1/T_2 \cdot u_x/u_y$, $T_2$ being a spin-spin-relaxation time of the reference substance.

3. Method according to claim 2, further comprising the step of subjecting the absorption signal $u_y$ to a low-pass filtration.

4. Method according to claim 1 wherein the compensation is carried out in dependence on a quantity $1/T_2 \cdot u_x/u_y + 1/u_y \cdot du_x/dt$, $T_2$ being a spin-spin-relaxation time of the reference substance.

5. Method according to claim 1 further comprising the step of detecting fast external field disturbances outside the electromagnets, subjecting the detected fast external field disturbances to a frequency characteristic correction and then using the corrected fast external field disturbances for generating a compensation circuit.

6. Method according to claim 1 further comprising the step of determining a spin-spin-relaxation time of the referenced substance, $T_2$, by feeding a predetermined electric signal $(u_x)_M$, which simulates a field disturbance, into the field correction coil and that after compensation of the simulated field disturbance, determining $T_2$ according to the formula $$T_2 = \frac{-(u_x)_M}{-\Delta\omega \, (u_y)_2}$$

in which $\Delta\omega = \gamma \Delta H_0$ the frequency change of the nuclear spin signals caused by the simulated disturbance, $\gamma$ the gyromagnetic relation, $\Delta H_0$ the field change generated in the compensation, and $(u_y)_2$ the $u_y$ signal after passing through a low pass filter.

7. Device for compensation of time variant field disturbances in magnetic fields of electromagnets with high field homogeneity said device comprising:
    means for phase-sensitive rectifying a dispersion signal $u_x$ of a nuclear signal of a reference substance and for acquiring an absorption signal $u_y$ of the reference substance nuclear signal;
    means for converting the dispersion and absorption signals into a first weighted signal $u_x/u_y$ and into a second weighted signal $(1/u_y)(du_x/dt)$; and
    means for generating a current, dependent on the weighted signals, in a field correction coil of the electromagnets.

8. Device according to claim 7, further comprising a measuring transducer for forming the combination $1/T_2 \cdot u_x/u_y$.

9. Device according to claim 7 further comprising a measuring transducer for forming the combination $1/T_2 \cdot u_x/u_y + 1/u_y \cdot du_x/dt$.

10. Device according to claim 7 further comprising at least one measuring transducer for forming the combination of dispersion and absorption signal and at least one regulator, each combined regulator and transducer forming a channel.

11. Device according to claim 10, further comprising means for switching and selecting an output from one or more of the regulators.

12. Device according to claim 10 further comprising means for controlling at least one of the group of devices consisting of a regulator and means for switching in dependence on the dispersion signal $u_x$ and the absorption signal $u_y$.

13. Device according to claim 10 wherein at least one regulator comprises an integrating amplifier.

14. Device according to claim 10 wherein at least one regulator comprises a double-integrating amplifier.

15. Device according to claim 8 further comprising a low-pass preceeds the y-input of the measuring transducer filter for forming the combination $1/T_2 \cdot u_x/u_y$.

16. Device according to claim 7 further comprising a field sensor for compensating of fast external field disturbances, said field sensor being disposed outside the electromagnets.

17. Method for compensation of time variant field disturbances in magnetic fields of electromagnets with high field homogeneity using a field correction coil, said method comprising the steps of acquiring a dispersion signal $u_x$ of the nuclear signal of a reference substance acquiring an absorption signal $u_y$ of the reference substance; combining the dispersion signals $u_x$ and absorption signal $u_y$ to form weights signals $u_x/u_y$ and $(1/u_y)(du_x/dt)$; and generating a current, dependent on the weighted signals, in the field correction coil, for compensating the field disturbances,
    the compensation being carried out in dependence on the quantity $1/T_2 \cdot u_x/u_y$, $T_2$ being the spin-spin-relaxation time of the reference substance, the absorption signal $u_y$ being subjected to a low-pass filtration,
    the compensation being carried out in dependence on the quantity $1/T_2 \cdot u_x/u_y + 1/u_y \cdot du_x/dt$, compensation of fast external field disturbance being made by detecting the external field disturbances outside the electromagnets, and subjecting the fast field disturbances to a frequency characteristic correction for generating a compensation current.

18. Device for compensation of time variant field disturbance in magnetic fields of electromagnets with high field homogeneity, said device comprising means for acquiring a dispersion signal $u_x$ of a nuclear signal of a reference substance and for acquiring an absorption signal $u_y$ of the reference substance nuclear signal and means for generating a current, dependent on a combination of the dispersion signal and absorption signal, in a field correction coil of the electromagnet;
    means for generating at least one of a weighted signal $u_x/u_y$ and $(1/u_y)(du_x/dt)$;
    a first measuring transducer for forming the quantity $1T_2 \cdot u_x/u_y$;
    a second measuring transducer for forming the quantity $1/T_2 \cdot u_x/u_y + 1/u_y \cdot du_x/dt$;
    at least one measuring transducer generating a regulator input signal, the input signal of the concerned regulator modified according to the control properties appearing at the output of said regulator;
    means for switching the one quantity or the other quantity or a combination of the quantities;
    means for controlling at least one of the group of devices consisting of regulator and means for switching in dependence on the dispersion signal $u_x$ and the absorption signal $u_y$;
    a low-pass generates the y-input of the measuring transducer for forming the quantity $1/T_2 \cdot u_x/u_y$;
    a field sensor for compensating of fast external field disturbances outside the electromagnets; and
    a digital computer for carrying out at least part of the device's operations mathematically.

* * * * *